United States Patent
Cheng et al.

(10) Patent No.: US 9,466,812 B2
(45) Date of Patent: Oct. 11, 2016

(54) ORGANIC ELECTROLUMINESCENT DEVICE PACKAGING STRUCTURE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/428,794

(22) PCT Filed: Jul. 25, 2014

(86) PCT No.: PCT/CN2014/083036
§ 371 (c)(1),
(2) Date: Mar. 17, 2015

(87) PCT Pub. No.: WO2015/039495
PCT Pub. Date: Mar. 26, 2015

(65) Prior Publication Data
US 2016/0013444 A1    Jan. 14, 2016

(30) Foreign Application Priority Data
Sep. 17, 2013  (CN) .......................... 2013 1 0425224

(51) Int. Cl.
*H01L 51/52*    (2006.01)

(52) U.S. Cl.
CPC ....... *H01L 51/5256* (2013.01); *H01L 51/5246* (2013.01); *H01L 51/5253* (2013.01); *H01L 2251/301* (2013.01); *H01L 2251/303* (2013.01); *H01L 2251/558* (2013.01)

(58) Field of Classification Search
CPC ............ H01L 51/5256; H01L 51/5246; H01L 2251/303; H01L 2251/558; H01L 2251/301
See application file for complete search history.

(56) References Cited

U.S. PATENT DOCUMENTS

| 1,599,517 A | 6/1926 | Forsythe |
| 5,505,985 A | 4/1996 | Nakamura et al. |

(Continued)

FOREIGN PATENT DOCUMENTS

| CN | 1239396 A | 12/1999 |
| CN | 1459996 A | 12/2003 |

(Continued)

OTHER PUBLICATIONS

Search Report issued in International Application No. PCT/CN2014/083036, dated Jul. 25, 2014.

(Continued)

*Primary Examiner* — John P Dulka
(74) *Attorney, Agent, or Firm* — Nath, Goldberg & Meyer; Joshua B. Goldberg; Christopher Thomas

(57) ABSTRACT

The present invention provides an organic electroluminescent device packaging structure, comprising a first substrate, a second substrate and an organic electroluminescent device, the organic electroluminescent device being arranged on the first substrate, and the second substrate and the first substrate being spaced apart to arrange the organic electroluminescent device in a sealed space between the first substrate and the second substrate, wherein the organic electroluminescent device packaging structure further comprises a first barrier layer and filling oil filled in the sealed space, and the first barrier layer covers the outer surface of the organic electroluminescent device.

20 Claims, 1 Drawing Sheet

(56) References Cited

U.S. PATENT DOCUMENTS

| | | | |
|---|---|---|---|
| 9,196,874 B2 * | 11/2015 | Boerner | ............... H01L 51/56 |
| 2003/0197197 A1 | 10/2003 | Brown et al. | |
| 2012/0256201 A1 | 10/2012 | Lee et al. | |

FOREIGN PATENT DOCUMENTS

| | | | | |
|---|---|---|---|---|
| CN | 101335291 A | * | 12/2008 | ......... H01L 51/5237 |
| CN | 101847650 A | | 9/2010 | |
| CN | 102664239 A | * | 9/2012 | ......... H01L 51/5256 |
| CN | 102859741 A | | 1/2013 | |
| CN | 103456892 A | | 12/2013 | |
| CN | 203644824 U | | 6/2014 | |

OTHER PUBLICATIONS

Notification of the First Office Action dated May 6, 2015 corresponding to Chinese application No. 201310425224.2.

Written Opinion of the International Searching Authority dated Oct. 29, 2014 corresponding to International application No. PCT/CN2014/083036.

Notification of the Second Office Action dated Dec. 21, 2015 corresponding to Chinese application No. 201310425224.2.

* cited by examiner

ORGANIC ELECTROLUMINESCENT DEVICE PACKAGING STRUCTURE

This is a National Phase Application filed under 35 U.S.C. 371 as a national stage of PCT/CN2014/083036 filed on Jul. 25, 2014, an application claiming the benefit to Chinese application No. 201310425224.2 filed on Sep. 17, 2013; the content of each of which is hereby incorporated by reference in its entirety.

FIELD OF THE INVENTION

The present invention relates to the field of display technology, and particularly relates to an organic electroluminescent device packaging structure.

BACKGROUND OF THE INVENTION

An organic electroluminescent device (OLED) is known as a most promising display device in the field of display and lighting due to many advantages of vibration withstanding, rapid response speed, wide viewing angle, wide operating temperature range, high luminance, low energy consumption and the like.

An organic electroluminescent device is very sensitive to water steam and oxygen, and water steam and oxygen permeating into the organic electroluminescent device are main factors influencing the service life of the organic electroluminescent device. Accordingly, the organic electroluminescent device is required to be sealedly packaged before use.

Currently, how to effectively prevent oxygen and/or water steam from entering the structure of the organic electroluminescent device has become a technical problem to be solved urgently in the art.

SUMMARY OF THE INVENTION

An object of the present invention is to provide an organic electroluminescent device packaging structure capable of effectively preventing oxygen and/or water steam from entering the interior of the organic electroluminescent device packaging structure.

To achieve the above object, the present invention provides an organic electroluminescent device packaging structure, including a first substrate, a second substrate and an organic electroluminescent device, the organic electroluminescent device being arranged on the first substrate, and the second substrate and the first substrate being spaced apart to arrange the organic electroluminescent device in a sealed space between the first substrate and the second substrate, wherein the organic electroluminescent device packaging structure further includes a first barrier layer and filling oil filled in the sealed space, and the first barrier layer covers the outer surface of the organic electroluminescent device.

The filling oil is one or more selected from a group consisting of silicone oil, phenyl trisilane, polydiphenylsiloxane, polydimethylsiloxane, paraffin oil, mineral oil, almond oil, corn oil, cottonseed oil, perfluoropolyether oil, linseed oil, cinnamon oil and coconut oil.

The material forming the first barrier layer is any one or more selected from a group consisting of silicon oxide, silicon nitride, silicon carbonitride and silicon oxynitride.

The thickness of the first barrier layer is between 100 nm and 1000 nm.

The organic electroluminescent device packaging structure further includes a second barrier layer, which covers the outer surface of the first barrier layer.

The second barrier layer is formed of an organic substance.

The organic substance is one or more selected from a group consisting of bisphenol A epoxy oligomer, polyethylene glycol diglycidyl ether, alkyl glycidyl ether, ε-caprolactone modified 3,4-epoxycyclohexylmethyl 3',4'-epoxycyclohexanecarboxylate, and 3,4-epoxycyclohexenylmethyl 3',4'-epoxycyclohexenylcarboxylate.

The viscosity index of the organic substance is between 3000 mPa·S and 7000 mPa·S before the organic substance is subjected to crosslinking and curing for forming the second barrier layer.

The thickness of the second barrier layer is between 1 μm and 5 μm.

The organic electroluminescent device packaging structure further includes a third barrier layer, which covers the outer surface of the second barrier layer.

The material forming the third barrier layer is any one or more selected from a group consisting of silicon oxide, silicon nitride, silicon carbonitride and silicon oxynitride.

The thickness of the third barrier layer is between 100 nm and 200 nm.

The organic electroluminescent device packaging structure further includes sealing agent arranged between the first substrate and the second substrate so that the first substrate, the second substrate and the sealing agent form the sealed space.

The material forming the sealing agent is thermosetting resin or photosensitive resin.

An embodiment of the present invention provides an organic electroluminescent device packaging structure. The organic electroluminescent device is packaged through combination of the filling oil and the first barrier layer, so that water steam and oxygen can be effectively prevented from contacting the organic electroluminescent device, and thus the service life of the organic electroluminescent device is prolonged.

BRIEF DESCRIPTION OF THE DRAWINGS

The accompanying drawings are intended to provide further understanding of the present invention and form part of the description, and are used for explaining the present invention together with the following specific embodiments, but not limiting the present invention. In the drawings.

DETAILED DESCRIPTION OF THE EMBODIMENTS

Specific embodiments of the present invention are described below in detail in conjunction with the accompanying drawings. It should be understood that the specific embodiments described herein are only intended for illustrating and explaining the present invention, instead of limiting the present invention.

Figure 1:
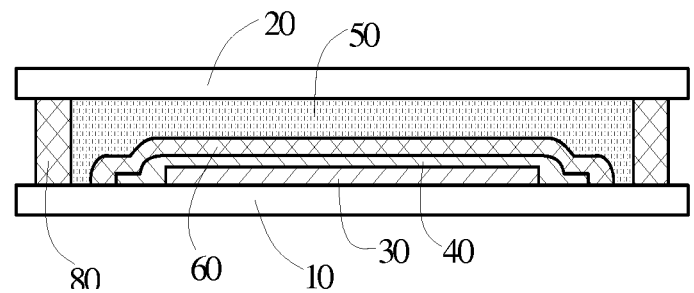
FIG. 1 is a schematic diagram of an organic electroluminescent device packaging structure provided by an embodiment of the present invention.
Figure 2:
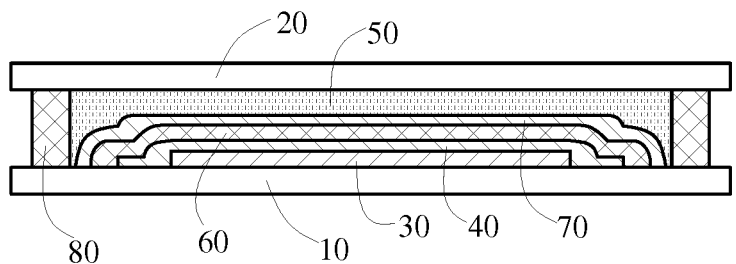
FIG. 2 is a schematic diagram of an organic electroluminescent device packaging structure provided by an embodiment of the present invention.
Figure 3:
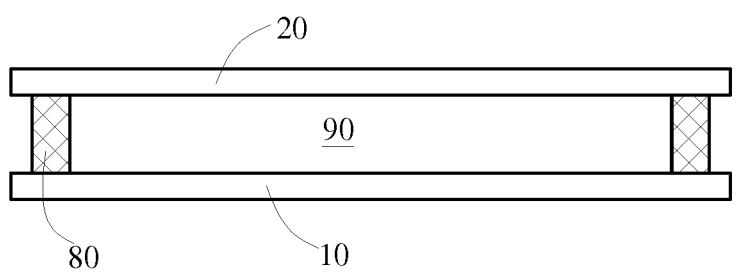
FIG. 3 is a schematic diagram illustrating a sealed space in the organic electroluminescent device packaging structure shown in FIGS. 1 and 2.

As shown in FIGS. 1-3, the present invention provides an organic electroluminescent device packaging structure, including a first substrate 10, a second substrate 20 and an organic electroluminescent device 30, the organic electroluminescent device 30 being arranged on the first substrate 10, and the second substrate 20 and the first substrate 10 being spaced apart to arrange the organic electroluminescent device 30 in a sealed space 90 (see FIG. 3) between the first substrate 10 and the second substrate 20, wherein the organic electroluminescent device packaging structure further includes a first barrier layer 40 and filling oil 50 filled in the sealed space 90, and the first barrier layer 40 covers the outer surface of the organic electroluminescent device 30 (the surface of the organic electroluminescent device 30 attaching to the first substrate 10 is an inner surface of the organic electroluminescent device 30).

Both the filling oil 50 and the first barrier layer 40 have the function of preventing water steam and oxygen from contacting the organic electroluminescent device 30, and combination thereof further reduces the risk that water steam and oxygen contact the organic electroluminescent device 30, so that the service life of the organic electroluminescent device 30 is prolonged.

As shown in FIGS. 1 and 2, the first barrier layer 40 covers the whole outer surface of the organic electroluminescent device 30, and thus the first barrier layer 40 can effectively prevent water steam and oxygen from contacting any portion of the organic electroluminescent device 30.

The first barrier layer 40 is located in the filling oil 50. Providing the filling oil 50 can prevent water steam and oxygen from contacting the first barrier layer 40, so that the risk that water steam and oxygen penetrate through the first barrier layer 40 and contact the organic electroluminescent device 30 is further reduced.

No special limitation is made to the specific material of the filling oil 50 in the present invention, as long as it can prevent water steam and oxygen from contacting the organic electroluminescent device.

It should be understood that, in the present invention, the first substrate 10, the second substrate 20, the first barrier layer 40 and the filling oil 50 are all transparent, so as not to affect exiting of light emitted by the organic electroluminescent device 30. For example, in the present invention, the filling oil 50 can be one or more selected from a group consisting of silicone oil, phenyl trisilane, polydiphenylsiloxane, polydimethylsiloxane, paraffin oil, mineral oil, almond oil, corn oil, cottonseed oil, perfluoropolyether oil, linseed oil, cinnamon oil and coconut oil.

In general, the height of spacing between the first substrate 10 and the second substrate 20 is between 3 μm and 10 μm, and the thickness of an oil film formed by the filling oil 50 is also between 3 μm and 10 μm. The filling oil 50 is transparent when the thickness of its material is between 3 μm and 10 μm. Likewise, in order to ensure transparency of the filling oil 50, preferably the viscosity index of the filling oil 50 may be between 200 mPa·S and 1000 mPa·S.

In the present invention, in order to ensure transparency of the first barrier layer 40 and reduce total cost of the organic electroluminescent device packaging structure, for example, the material forming the first barrier layer 40 can be any one or more selected from a group consisting of silicon oxide (SiOx), silicon nitride (SiNx), silicon carbonitride (SiCxNy) and silicon oxynitride (SiOxNy). It should be understood that, in the above four compounds, the value of x in the chemical genetic formula of each compound can be the same as or different from the value of x in the chemical genetic formula of another compound. Similarly, the value of y in the chemical genetic formula of silicon carbonitride can be the same as or different from the value of y in the chemical genetic formula of silicon oxynitride. The first barrier layer 40 can be deposited on the organic electroluminescent device 30 by means of plasma deposition, sputtering or the like.

In the embodiment, the thickness of the first barrier layer 40 may be set between 100 nm and 1000 nm.

To further improve sealing performance of the organic electroluminescent device packaging structure, as shown in FIG. 1, the organic electroluminescent device packaging structure may further include a second barrier layer 60, which covers the outer surface of the first barrier layer 40 (the surface of the first barrier layer 40 attaching to the organic electroluminescent device 30 and the first substrate 10 is the inner surface of the first barrier layer 40). The second barrier layer 60 covers the whole outer surface of the first barrier layer 40, so that water steam and oxygen can be prevented from contacting any portion of the first barrier layer 40. It should be understood that the second barrier layer 60 is also transparent.

In the embodiment, the second barrier layer 60 may be formed of an organic substance. The advantage of using the organic substance to make the second barrier layer 60 is that as the second barrier layer 60 is disposed on the first barrier 40 by coating, complex process of forming an inorganic barrier layer (such as plasma deposition, sputtering or the like) is avoided.

The second barrier layer 60 may be obtained by cross-linking and curing oligomer. Thus, the organic substance forming the second barrier layer 60 may be thermosetting resin or photosensitive resin. Specifically, the organic substance is one or more selected from a group consisting of bisphenol A epoxy oligomer, polyethylene glycol diglycidyl ether, alkyl glycidyl ether, ϵ-caprolactone modified 3,4-epoxycyclohexylmethyl 3',4'-epoxycyclohexanecarboxylate and 3,4-epoxycyclohexenylmethyl 3',4'-epoxycyclohexenylcarboxylate.

To facilitate coating, for example, the viscosity index of the organic substance may be between 3000 mPa·S and 7000 mPa·S before the organic substance is subjected to cross-linking and curing for forming the second barrier layer 60.

To ensure uniform thickness of the second barrier layer 60 and maintain transparency of the second barrier layer 60, for example, the thickness of the second barrier layer 60 may be set between 1 μm and 5 μm.

To further prevent oxygen and water steam from entering the organic electroluminescent device 30, as shown in FIG. 2, the organic electroluminescent device packaging structure may further include a third barrier layer 70, which covers the outer surface of the second barrier layer 60 (the surface of the second barrier layer 60 attaching to the first barrier layer 40 and the first substrate 10 is the inner surface of the second barrier layer 60).

In this embodiment, the third barrier layer 70 may be made of material the same as or similar to that of the first barrier layer 40, that is, the material forming the third barrier layer 70 is any one or more selected from a group consisting of silicon oxide, silicon nitride, silicon carbonitride and silicon oxynitride.

For convenience of manufacturing, for example, the thickness of the third barrier layer 70 may be set between 100 nm and 200 nm.

As described above, the organic electroluminescent device 30 is formed in the sealed space, and in order to form the sealed space, as shown in FIG. 3, the organic electroluminescent device packaging structure further includes sealing agent 80 arranged between the first substrate 10 and the second substrate 20, wherein the first substrate 10, the second substrate 20 and the sealing agent 80 form the sealed space 90.

In general, the material forming the sealing agent 80 may be thermosetting resin or photosensitive resin. For example, the material forming the sealing agent 80 may be epoxy resin, epoxy phenol, epoxy polyurethane, phenolic resin, carbamate resin or other thermosetting resin.

A manufacturing method of the organic electroluminescent device packaging structure shown in FIG. 2 is described below, including the following steps S1-S5.

S1. providing a first substrate 10, and preparing an organic electroluminescent device 30 on the first substrate 10;

S2. preparing a first barrier layer 40, a second barrier layer 60 and a third barrier layer 70 successively on the first substrate 10;

S3. coating on the first substrate 10 sealing agent 80 for forming a sealed space, and pre-curing the sealing agent;

S4. filling the space formed by the pre-cured sealing agent 80 and the first substrate 10 with filling oil 50;

S5. assembling the first substrate 10 and the second substrate 20, and heating the assembled first substrate 10 and second substrate 20, so that the sealing agent is further cured to form the organic electroluminescent device packaging structure.

The volume of the sealed space 90 and the amount of the filling oil 50 needed in step S4 can be defined according to the needed specific dimensions of the organic electroluminescent device packaging structure, and the space formed by the third barrier layer 70, the sealing agent 80 and the second substrate 20 is full of the filling oil 50.

As the organic electroluminescent device packaging structure has good sealing performance, water steam and oxygen can be effectively prevented from contacting the organic electroluminescent device, and thus the service life of the organic electroluminescent device is prolonged.

It can be understood that the above embodiments are only exemplary embodiments for illustrating the principle of the present invention; however, the present invention is not limited thereto. Various variations and improvements can be made by those of ordinary skill in the art without departing from the spirit and essence of the present invention, and these variations and improvements should also be considered to be within the protection scope of the present invention.

The invention claimed is:

1. An organic electroluminescent device packaging structure, comprising a first substrate, a second substrate and an organic electroluminescent device, the organic electroluminescent device being arranged on the first substrate, and the second substrate and the first substrate being spaced apart to arrange the organic electroluminescent device in a sealed space between the first substrate and the second substrate, wherein the organic electroluminescent device packaging structure further comprises a first barrier layer and filling oil filled in the sealed space, and the first barrier layer covers the outer surface of the organic electroluminescent device.

2. The organic electroluminescent device packaging structure according to claim 1, wherein the filling oil is one or more selected from a group consisting of silicone oil, phenyl trisilane, polydiphenylsiloxane, polydimethylsiloxane, paraffin oil, mineral oil, almond oil, corn oil, cottonseed oil, perfluoropolyether oil, linseed oil, cinnamon oil and coconut oil.

3. The organic electroluminescent device packaging structure according to claim 2, wherein the organic electroluminescent device packaging structure further comprises a second barrier layer, which covers the outer surface of the first barrier layer.

4. The organic electroluminescent device packaging structure according to claim 2, wherein the material forming the first barrier layer is any one or more selected from a group consisting of silicon oxide, silicon nitride, silicon carbonitride and silicon oxynitride.

5. The organic electroluminescent device packaging structure according to claim 4, wherein the thickness of the first barrier layer is between 100 nm and 1000 nm.

6. The organic electroluminescent device packaging structure according to claim 4, wherein the organic electroluminescent device packaging structure further comprises a second barrier layer, which covers the outer surface of the first barrier layer.

7. The organic electroluminescent device packaging structure according to claim 1, wherein the material forming the first barrier layer is any one or more selected from a group consisting of silicon oxide, silicon nitride, silicon carbonitride and silicon oxynitride.

8. The organic electroluminescent device packaging structure according to claim 7, wherein the organic electroluminescent device packaging structure further comprises a second barrier layer, which covers the outer surface of the first barrier layer.

9. The organic electroluminescent device packaging structure according to claim 7, wherein the thickness of the first barrier layer is between 100 nm and 1000 nm.

10. The organic electroluminescent device packaging structure according to claim 9, wherein the organic electroluminescent device packaging structure further comprises a second barrier layer, which covers the outer surface of the first barrier layer.

11. The organic electroluminescent device packaging structure according to claim 1, wherein the organic electroluminescent device packaging structure further comprises a second barrier layer, which covers the outer surface of the first barrier layer.

12. The organic electroluminescent device packaging structure according to claim 11, wherein the thickness of the second barrier layer is between 1 μm and 5 μm.

13. The organic electroluminescent device packaging structure according to claim 11, wherein the second barrier layer is formed of an organic substance.

14. The organic electroluminescent device packaging structure according to claim 13, wherein the organic substance is one or more selected from a group consisting of bisphenol A epoxy oligomer, polyethylene glycol diglycidyl ether, alkyl glycidyl ether, ε-caprolactone modified 3,4-epoxycyclohexylmethyl 3',4'-epoxycyclohexanecarboxylate and 3,4-epoxycyclohexenylmethyl 3',4'-epoxycyclohexenylcarboxylate.

15. The organic electroluminescent device packaging structure according to claim 14, wherein the viscosity index of the organic substance is between 3000 mPa·S and 7000 mPa·S before the organic substance is subjected to cross-linking and curing for forming the second barrier layer.

16. The organic electroluminescent device packaging structure according to claim 11, wherein the organic electroluminescent device packaging structure further comprises a third barrier layer, which covers the outer surface of the second barrier layer.

17. The organic electroluminescent device packaging structure according to claim 16, wherein the material forming the third barrier layer is any one or more selected from a group consisting of silicon oxide, silicon nitride, silicon carbonitride and silicon oxynitride.

18. The organic electroluminescent device packaging structure according to claim 17, wherein the thickness of the third barrier layer is between 100 nm and 200 nm.

19. The organic electroluminescent device packaging structure according to claim 1, further comprising sealing agent arranged between the first substrate and the second substrate so that the first substrate, the second substrate and the sealing agent form the sealed space.

20. The organic electroluminescent device packaging structure according to claim 19, wherein the material forming the sealing agent is thermosetting resin or photosensitive resin.

\* \* \* \* \*